(12) United States Patent
Yoon et al.

(10) Patent No.: US 9,117,962 B2
(45) Date of Patent: Aug. 25, 2015

(54) CIGS LIGHT-ABSORBING INK AND METHOD FOR PREPARING CIGS LIGHT-ABSORBING LAYER

(71) Applicant: GS CALTEX CORPORATION, Seoul (KR)

(72) Inventors: Yeokwon Yoon, Daejeon (KR); Tae-Seok Lee, Daejeon (KR); Kyoung-Jun Lee, Seoul (KR); Jae-Hong Kim, Daejeon (KR)

(73) Assignee: GS CALTEX CORPORATION, Seoul (KR)

( * ) Notice: Subject to any disclaimer, the term of this patent is extended or adjusted under 35 U.S.C. 154(b) by 0 days.

(21) Appl. No.: 14/509,575

(22) Filed: Oct. 8, 2014

(65) Prior Publication Data

US 2015/0132885 A1    May 14, 2015

Related U.S. Application Data

(63) Continuation-in-part of application No. PCT/KR2013/005699, filed on Jun. 27, 2013.

(30) Foreign Application Priority Data

Nov. 13, 2012   (KR) ........................ 10-2012-0128283

(51) Int. Cl.
*H01L 29/72* (2006.01)
*H01L 31/18* (2006.01)
*H01L 31/032* (2006.01)
*C09D 11/52* (2014.01)

(52) U.S. Cl.
CPC ................ *H01L 31/18* (2013.01); *C09D 11/52* (2013.01); *H01L 31/0322* (2013.01); *H01L 31/1864* (2013.01)

(58) Field of Classification Search
CPC ................................ H01L 45/04; H01L 21/00
USPC .............. 438/95; 252/501; 257/431, 439, 607
See application file for complete search history.

(56) References Cited

U.S. PATENT DOCUMENTS

| | | | | |
|---|---|---|---|---|
| 2009/0280624 | A1* | 11/2009 | Curtis et al. | 438/478 |
| 2011/0031453 | A1* | 2/2011 | Fujdala et al. | 252/519.14 |
| 2011/0137061 | A1* | 6/2011 | Wang | 556/110 |

FOREIGN PATENT DOCUMENTS

| | | |
|---|---|---|
| KR | 20110065596 A | 6/2011 |
| KR | 20120023452 A | 3/2012 |
| WO | 2006070800 A1 | 7/2006 |

OTHER PUBLICATIONS

Korean Notice of Allowance mailed on Apr. 17, 2014, citing the above reference(s).

(Continued)

*Primary Examiner* — Edward Wojciechowicz
(74) *Attorney, Agent, or Firm* — Lowe Hauptman & Ham, LLP

(57) ABSTRACT

The present invention relates to a method for preparing a CIS- or CIGS-based light-absorbing layer which is included in a thin film solar cell. More particularly, the present invention relates to a method for preparing a CIS- or CIGS-based light-absorbing layer which ultimately improves the efficiency of a solar cell since the remaining carbon impurities in the formed light-absorbing layer are minimized and additional sulfurization treatment or selenium treatment is made optional, not requisite.

20 Claims, 4 Drawing Sheets

(56) References Cited

OTHER PUBLICATIONS

David B. Mitzi et al., A High-Efficiency Solution-Deposited Thin-Film Photovoltaic Device, 2008, pp. 3657-3662, vol. 20, WILEY-VCH Verlag GmbH & Co. KGaA, Weinheim.

Jong Won Park et al., Synthesis of CIGS absorber layers via a paste coating, Journal, 2009, pp. 2621-2625, Elsevier.

Vijay K. Kapur et al, Non-vacuum processing of $CuIn_{1-x}Ga_xSe_2$ solar cells on rigid and flexible substrates using nanoparticle precursor inks, 2003, pp. 53-57, Elsevier Science.

International Search Report for PCT/KR2013/005699, mailed on Sep. 30, 2013, citing the above reference(s).

* cited by examiner

CIGS LIGHT-ABSORBING INK AND METHOD FOR PREPARING CIGS LIGHT-ABSORBING LAYER

CROSS REFERENCE TO RELATED APPLICATION

This application is a Bypass Continuation-In-Part (CIP) Application of International Application No. PCT/KR2013/005699 filed on Jun. 27, 2013 which claims the priority of Korean Patent Application No. 10-2012-0128283 filed on Nov. 13, 2012 in the KIPO (Korean Intellectual Property Office), the disclosures of which are incorporated by reference herein in their entirety.

TECHNICAL FIELD

The present invention relates to a method for preparing a CIS- or CIGS-based light-absorption layer for thin-film solar cells. More particularly, the present invention relates to a method for preparing a CIS- or CIGS-based light-absorption layer, which allows separate sulfurization or selenization to be selectively performed instead of being necessarily performed and can minimize carbon impurities in the light-absorption layer, thereby ultimately improving conversion efficiency of solar cells.

BACKGROUND ART

A solar cell is an essential device of a photovoltaic system that directly converts sunlight into electricity.

Generally, a solar cell is divided into a single-crystal silicon solar cell, a polycrystalline silicon solar cell, and a thin-film solar cell.

The single-crystal silicon solar cell has higher conversion efficiency than other kinds of solar cells and is suited for mass production through process improvement.

The polycrystalline silicon solar cell employs a low-grade silicon wafer as a source material. Although the polycrystalline silicon solar cell requires low fabrication costs, the polycrystalline silicon solar cell has lower conversion efficiency than that of the single-crystal silicon solar cell.

Since such single-crystal and polycrystalline silicon solar cells are prepared using a source material in a bulk state, these solar cells have problems of high material costs and a complicated fabrication process, thereby providing constraints on cost reduction.

To solve these problems, thin-film solar cells prepared through significant reduction in thickness of a substrate or through deposition of a thin-film solar cell on an inexpensive substrate such as a glass sheet have attracted attention in the art. Although the thin-film solar cell has lower conversion efficiency than the single-crystal and polycrystalline silicon solar cells, the thin-film solar cell has a possibility of reducing fabrication costs.

Recently, studies have been conducted to develop a thin-film solar cell using a compound semiconductor material such as CdTe, CuInSe$_2$ (CIS), or CuInGaSe$_2$ (CIGS), which has relatively high conversion efficiency. Particularly, many attempts have been made to further improve conversion efficiency of a thin-film solar cell using a CIS or CIGS compound semiconductor having relatively high conversion efficiency in a light-absorption layer.

Although the CIS or CIGS light-absorption layer is prepared by vacuum deposition, there are problems of complicated processing conditions, difficulty fabricating a large-area product, and large loss of a source material.

To solve these problems with vacuum deposition, a method for fabricating a non-vacuum CIS or CIGS light-absorption layer, which does not use vacuum apparatus, is known in the art. Particularly, a printing method for fabricating a CIS or CIGS thin-film is known as the most available method in terms of processing speed, processing cost, and formation of large-area products.

Fabrication of the CIS or CIGS light-absorption layer by the printing method generally includes a method using ink or paste composed of a precursor and a method using ink or paste prepared by forming CIG or CIGS nanoparticles and distributing the particles.

As an exemplary method using a precursor, a method by Mitzi et al., disclosed in Advanced Materials, 2008, 20, 3657-3662, includes dissolving a binary compound, such as Cu$_2$S, In$_2$Se$_3$, or Ga$_2$Se, in hydrazine to form a precursor ink, depositing the precursor ink on a conductive substrate, and heat-treating the precursor ink under a nitrogen atmosphere, thereby fabricating a CIGS light-absorption layer. Further, a method by Min et al., disclosed in Journal of Crystal Growth, 2009, 311, 2621-2625, includes preparing paste by dissolving Cu(NO$_3$)$_2$, In(NO$_3$)$_3$, Ga(NO$_3$)$_3$, and SeCl$_4$ in an alcohol solvent and mixing an organic binder or the like therewith, depositing the paste on a conductive substrate, and then heat-treating the paste under a H$_2$/Ar atmosphere, thereby fabricating a CIGS thin-film.

As an exemplary method using nano-particles, a method by Kapur et al., disclosed in Thin Solid Films, 2003, 431-432, and 53-57, includes synthesizing and distributing CuInGa oxide nano-particles, depositing the nano-particles on a conductive substrate, and heat-treating the nano-particles under an H$_2$Se-gas atmosphere, thereby fabricating a CIGS light-absorption layer.

Thereamong, the method using a precursor has a problem in that a large amount of carbon impurities remains when heat treatment is performed under a hydrogen or nitrogen atmosphere. Further, when a solvent such as hydrazine is used, remaining carbon impurities can be decreased. In this case, however, there is a drawback in that industrial applicability is restricted due to highly explosive properties of hydrazine.

The remaining carbon impurities act as a main element causing reduction in conversion efficiency of a solar cell. Thus, in order to solve the problems of the method for fabricating a light absorption layer by printing, there is a need for a preparation method capable of minimizing remaining carbon impurities while using a stable organic solvent.

DISCLOSURE

Technical Problem

The present invention is aimed at solving such problems in the art, and more particularly, at providing a method for preparing a CIS- or CIGS-based light-absorption layer, which allows separate sulfurization or selenization to be selectively performed instead of being necessarily performed and can minimize carbon impurities in the light-absorption layer, thereby ultimately improving solar cell conversion efficiency.

Technical Solution

In accordance with one aspect of the present invention, a method for preparing a light-absorption layer for CIS- or CIGS-based solar cells includes: (a) preparing a light-absorption ink, the light-absorption ink including a precursor of copper, indium, or gallium as an organic metal precursor, a solvent, and sulfur or selenium, wherein a ligand in the organic metal precursor exhibits keto-enol tautomerism; and (b) coating the light-absorption ink onto a substrate, followed by heat treatment.

More specifically, the method includes: preparing a starting material containing a metal organic precursor by mixing a precursor of copper, indium or gallium; mixing the starting material with sulfur or selenium and a solvent to prepare a light-absorption ink; mixing the light-absorption ink with a chelating agent to form a complex; and coating the light-absorption ink onto a substrate to form a thin film, followed by heat treatment, wherein the preparation of the light-absorption ink and the formation of the complex are sequentially or simultaneously carried out.

In accordance with another aspect of the present invention, there is provided a light-absorption ink for solar cells, which includes a precursor of copper, indium, or gallium as an organic metal precursor, a solvent, and sulfur or selenium, wherein a ligand in the organic metal precursor exhibits keto-enol tautomerism.

Advantageous Effects

Since the preparation method according to the present invention does not require a vacuum apparatus and minimizes consumption of a metal source material, the preparation method is very advantageous in terms of improvement of processing speed, processing cost, and formation of large area products.

In addition, since the light-absorption ink contains sulfur or selenium, the method according to the present invention allow separate sulfurization or selenization to be selectively performed instead of being necessarily performed, thereby improving process efficiency.

Further, the method according to the present invention can minimize carbon impurities in the light-absorption layer by providing a binder-free type light-absorption ink, thereby preventing deterioration in solar cell conversion efficiency.

DESCRIPTION OF DRAWINGS

FIGS. 3(a) and 3(b) show SEM (scanning electron microscope) images of the light-absorption layer prepared in Example 1, in which FIG. 3(a) shows a surface of the light-absorption layer and FIG. 3(b) shows a cross-section of the light-absorption layer.

BEST MODE

Figure 1:
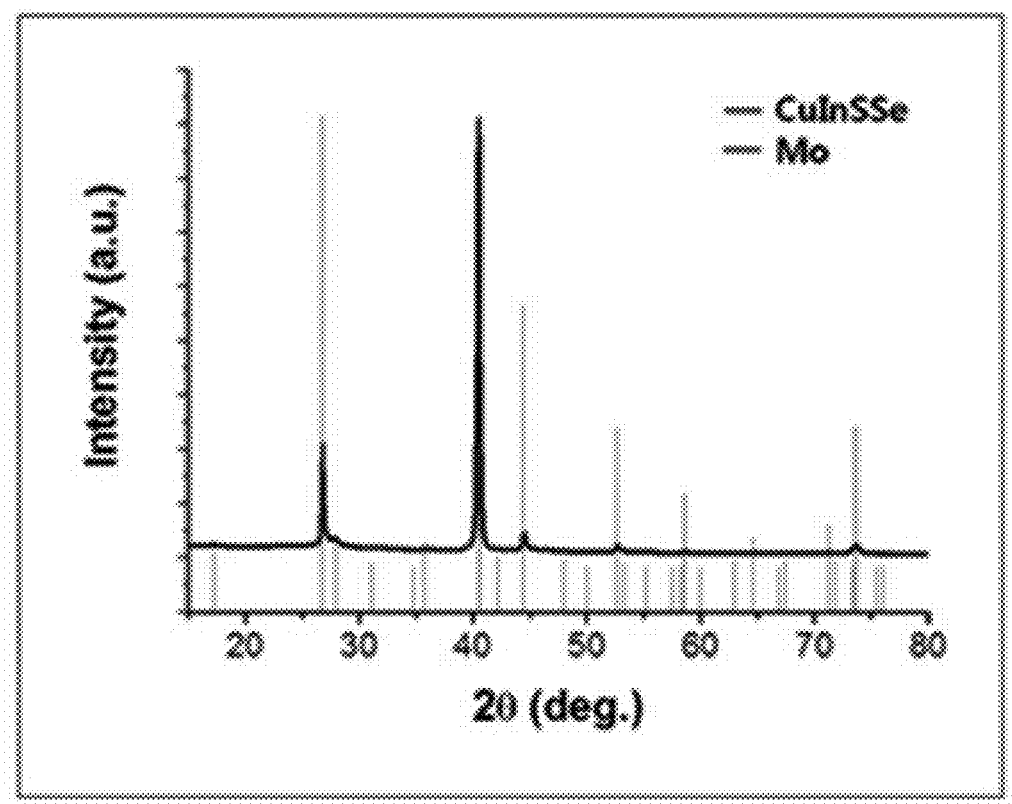
FIG. 1 shows a result of XRD (x-ray diffraction) data analysis for a light-absorption layer prepared in Example 1.

Detailed features of other embodiments are included in the following description and the accompanying drawings.

The above and other aspects, features and advantages of the present invention will become apparent from the detailed description of the following embodiments in conjunction with the accompanying drawings. However, it should be understood that the present invention is not limited to the following embodiments and may be embodied in different ways, and that the embodiments are provided for complete disclosure and thorough understanding of the invention by those skilled in the art. The scope of the invention should be defined only by the accompanying claims and equivalents thereof.

Hereinafter, exemplary embodiments of the present invention will be described in detail.

In accordance with one aspect of the present invention, a method for preparing a light-absorption layer for CIS- or CIGS-based solar cells includes: (a) preparing a light-absorption ink, the light-absorption ink including a precursor of copper, indium, or gallium as an organic metal precursor, a solvent, and sulfur or selenium, wherein a ligand in the organic metal precursor exhibits keto-enol tautomerism; and (b) coating the light-absorption ink onto a substrate, followed by heat treatment.

More specifically, the method includes: preparing a starting material containing a metal organic precursor by mixing a precursor of copper, indium or gallium; mixing the starting material with sulfur or selenium and a solvent to prepare a light-absorption ink; mixing the light-absorption ink with a chelating agent to form a complex; and coating the light-absorption ink onto a substrate to form a thin film, followed by heat treatment, wherein the preparation of the light-absorption ink and the formation of the complex are sequentially or simultaneously carried out.

First, the starting material including the metal organic precursor is prepared by mixing the precursor of copper, indium or gallium.

The precursor of copper, indium or gallium is a precursor that can generate metal ions. Although the precursor generally uses hydroxides, nitrates, sulfates, acetates, chlorides, or oxides of the metal ions or a mixture thereof, according to the present invention, the metal organic precursor is preferably a precursor in which a ligand in the organic metal precursor exhibits keto-enol tautomerism. More preferably, the ligand preferably comprises an acetylacetonate compound of the metal ions or a mixture thereof, which includes acetylacetonate. Thus, the precursors of copper, indium and gallium may be copper acetylacetonate ($Cu(acac)_2$), indium acetylacetonate ($In(acac)_3$), and gallium acetylacetonate ($Ga(acac)_3$), respectively. These compounds are selected for the purpose of using keto-enol tautomerism of the acetylacetonate included in the precursor and acetylacetone described below, which is a most-preferable solvent. This will be described in detail in the description with respect to a solvent.

The precursors of copper, indium and gallium may have a mole ratio of 1:0.5 to 2:0 to 2 in order to maximize light-conversion efficiency.

Next, the light-absorption ink is prepared by mixing the starting material with sulfur or selenium and a solvent.

When sulfur or selenium is added in the preparation of the light-absorption ink, separate sulfurization or selenization may be selectively performed instead of being necessarily performed, thereby improving process efficiency.

Here, the solvent preferably contains a ketone compound in order to allow the starting material to be dissolved in the solvent through simple heat treatment when the structure of acetylacetonate contained in the metal precursor becomes a keto form due to keto-enol tautomerism.

That is, as represented by Formula 1, keto-enol tautomerism refers to a chemically equilibrium state between a keto form and an enol form, wherein the keto form and the enol form are rapidly interconverted to each other through the movement of a proton and the shifting of bonding electrons. Such specific isomers are called tautomers of each other.

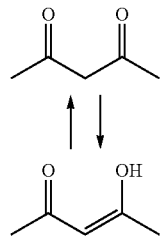

[Formula 1]

According to the present invention, the organic compound (for example, acetylacetonate) contained in the metal organic precursor is removed together with the solvent by heat treatment based on keto-enol tautomerism, thereby forming a light-absorption layer in which carbon impurities are minimized. An exemplary mechanism using copper acetylacetonate as the metal organic precursor can be represented by Formula 2.

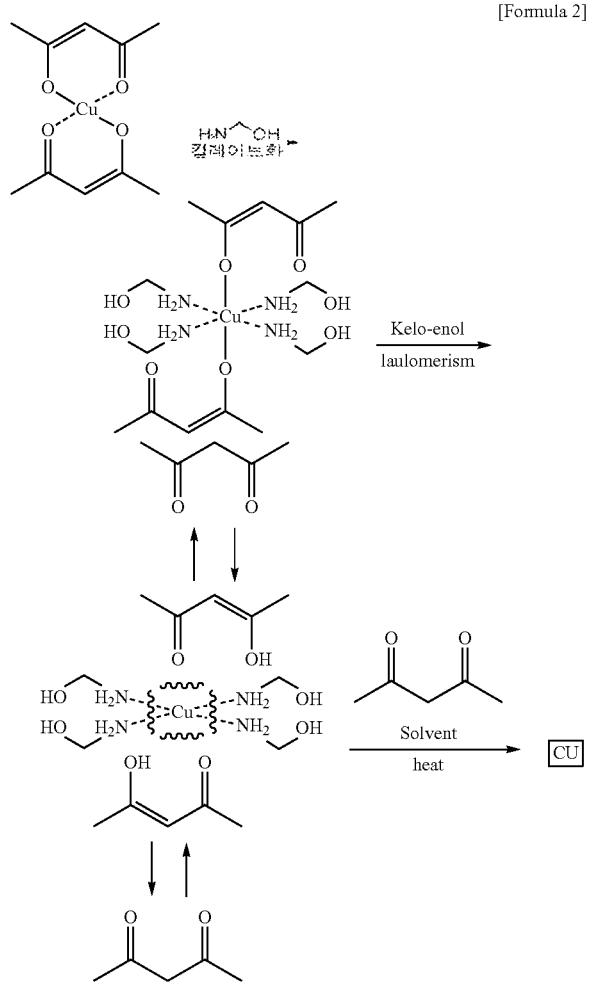

[Formula 2]

Accordingly, the solvent may include any ketone compound, and preferably includes at least one selected from among acetylacetone, acetone, methylacetylacetate, tertbutyl acetoacetate, and ethyl-2-methylacetoacetate.

Next, the complex is prepared by mixing the light-absorption ink with the chelating agent.

When mixed with the metal organic precursor contained in the starting material, the chelating agent is stabilized while forming the complex. In the present invention, the chelating agent may include any chelating agent which can form a complex with a molecular structure in the starting material. Preferably, the chelating agent includes amine or amine alcohol.

For example, when copper acetylacetonate is mixed with ethanolamine, a complex is formed as represented by Formula 3.

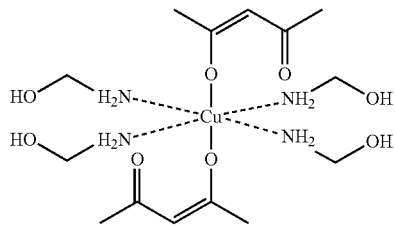

[Formula 3]

When such a complex is formed, solubility of the metal organic precursor increases with respect to solvent comprising the ketone compound in the ink, and thus the metal organic precursor is stabilized. Thus, keto-enol tautomerism is efficiently achieved by the ketone compound solvent. In addition, the formation of the complex provides sufficient viscosity such that a binder is not required, thereby forming a binder-free light-absorption ink.

Amine or amine alcohol may include at least one selected from among monoalkylamine ($RNH_2$; R being a $C_1$ to $C_8$ alkyl group), dialkylamine ($R_1R_2NH$: $R_1$ and $R_2$ being a $C_1$ to $C_8$ alkyl group), trialkylamine ($R_1R_2R_3N$: $R_1$, $R_2$ and $R_3$ being a $C_1$ to $C_8$ alkyl group), diamine ($R_1R_2N$—R—$NR_3R_4$; R, $R_1$, $R_2$, $R_3$ and $R_4$ being H or a $C_1$ to $C_8$ alkyl group), monoalcoholamine ($RHN_2OH$: R being a $C_1$ to $C_8$ alkyl group), dialcoholamine [($R_1OH$)($R_2OH$)NH: $R_1$ and $R_2$ being a $C_1$ to $C_8$ alkyl group], trialcoholamine [($R_1OH$)($R_2OH$)($R_3OH$)N: $R_1$, $R_2$ and $R_3$ being a $C_1$ to $C_8$ alkyl group].

On the other hand, the method according to the present invention may include preparing the light-absorption ink by mixing the solvent comprising the ketone compound with the starting material comprising sulfur or selenium, and preparing the complex by mixing the prepared light-absorption ink with amine or amine alcohol used as a chelating agent, without being limited thereto. That is, after the starting material containing the metal organic precursor is prepared, sulfur or selenium is mixed with the starting material, the solvent comprising the ketone compound and the amine or amine alcohol may be simultaneously added thereto to form the complex. Alternatively, after the starting material containing the metal organic precursor and sulfur or selenium is prepared, the prepared starting material may be first added to the amine or amine alcohol and then added to the solvent comprising the ketone compound.

In the claims, the expression "the preparation of the light-absorption ink and the formation of the complex are sequentially performed" means that after the light-absorption ink is prepared by mixing the solvent comprising the ketone compound with the starting material containing the metal organic precursor and sulfur or selenium, the prepared light-absorption ink and the amine or amine alcohol which is a chelating agent are mixed to form the complex, and after the starting material containing the metal organic precursor and sulfur or selenium is prepared, the starting material is first added to the amine or amine alcohol and then is added to the solvent comprising the ketone compound.

Next, the light-absorption ink, in which the complex is formed, is coated as a thin film on a substrate, followed by heat treatment.

Here, the substrate may be composed of any conductive material capable of resisting burning temperature, including, for example, ITO or FTO glass, Mo-coated glass, metal foil, a metal plate, a conductive polymer material, a conductive film-coated non-conductive substrate, or the like.

Thin-film coating may be performed by any typical methods including, for example, doctor-blade coating, screen-coating, spin-coating, spray-coating, slot-die coating, and the like. The coating thickness may ranges from 0.1 micrometers to 10 micrometers.

Heat treatment may be performed in a temperature ranging from 100° C. to 400° C. If heat treatment is performed at a temperature of less than 100° C., the solvent is not completely removed, and if heat treatment is performed at a temperature of higher than 400° C., a thin film can suffer from cracking. By heat treatment, a material, such as a solvent and a chelating agent, which can remain as a carbon source, is removed, thereby minimizing a remaining amount of carbon impurities.

According to the present invention, the thin film is optionally heat treated under a hydrogen atmosphere, a sulfurization atmosphere, or a selenization gas atmosphere so as to from a CI or CIG thin-film through reduction, sulfurization, or selenization.

According to the present invention, since the light-absorption ink contains sulfur or selenium, separate sulfurization or selenization is not necessarily performed. Rather, separate sulfurization or selenization may be supplementarily performed in the case where sulfur or selenium is lost by vaporization upon heat treatment for the preparation of the thin film.

Such reduction, sulfurization or selenization may be performed by heat treatment under an atmosphere of $H_2$ or $H_2S$, S, $H_2Se$, Se, or a gas mixture of these gas and inert gas.

Heat treatment temperature may be determined depending upon the kind of substrate, preferably in the range from 400° C. to 600° C. Heat treatment at a temperature of less than 400° C. can cause insufficient crystallization and heat treatment at a temperature of higher than 600° C. can cause melting of a glass substrate.

As such, in the method according to the embodiment of the invention, stabilization can be achieved using a chelating agent by forming a complex of a metal organic precursor to be used in a light-absorption layer, a binder-free light-absorption layer can be prepared using a solvent having the same structure as the molecular structure in the complex, and the remaining carbon impurities in the light-absorption layer can be minimized, thereby improving solar cell efficiency.

In accordance with another aspect of the present invention, a light-absorption ink for solar cells includes a precursor of copper, indium, or gallium as an organic metal precursor, a solvent, and sulfur or selenium, wherein a ligand in the organic metal precursor exhibits keto-enol tautomerism.

The light-absorption ink may form a complex with a metal organic precursor in terms of improved stability, solubility and viscosity of the light-absorption ink.

In the light-absorption ink, the precursor of copper, indium or gallium, sulfur or selenium, the solvent, and the chelating agent have the same features as in the description of the preparation method.

The light-absorption layer for CIS- or CIGS-based solar cells may be formed by coating the light-absorption ink onto the substrate to form a thin film, followed by heat treatment.

Optionally, the obtained thin-film is subjected to additional heat treatment under a hydrogen, sulfurization, or selenization atmosphere so as to form a reduced, sulfurized, or selenized CI or CIG thin-film, thereby forming a light-absorption layer for CIS- or CIGS-based solar cells.

Hereinafter, the present invention will be described in more detail with reference to some examples. However, it should be understood that these examples are provided for illustration only and are not to be construed in any way as limiting the present invention.

1. PREPARATIVE EXAMPLES

Example 1

Preparation of CIS Light-absorption Layer

After a starting material was prepared by mixing 400 mg (1.52 mmol) of $Cu(acac)_2$ with 628 mg (1.52 mmol) of $In(acac)_3$, 96 mg (3.04 mmol) of sulfur was mixed with the starting material, and 1.3 ml of acetylacetone and 2.7 ml of ethanolamine were mixed with the mixture to form a complex. Next, a light-absorption ink was prepared by stiffing the complex at 140° C. for 1 hour.

The prepared light-absorption ink was coated onto a Mo glass substrate by doctor-blade coating or spin-coating, and then heat-treated at 200° C. for 4 minutes and at 350° C. for 30 minutes under an air atmosphere, thereby obtaining a light-absorption layer thin-film.

The light-absorption layer thin-film was heat-treated at 550° C. for 15 minutes under a Se atmosphere, thereby forming a CIS light-absorption layer thin-film.

Example 2

Preparation of CIGS Light-absorption Layer

A CIGS light-absorption layer thin-film was prepared in the same manner as in Example 1, except that a starting material was prepared by mixing 436 mg (1.06 mmol) of $In(acac)_3$ and 168 mg (0.46 mmol) of $Ga(acac)_3$, instead of 628 mg (1.52 mmol) of $In(acac)_3$.

Comparative Example 1

Preparation of CIGS Light-absorption Layer Using CIG Precursor Paste

A CIG precursor paste was obtained by dissolving 1 g (5 mmol) of $Cu(NO_3)_2.xH_2O$, 0.4 g (1.6 mmol) of $Ga(NO_3)_3.xH_2O$, 1.12 g (3.7 mmol) of $In(NO_3)_3.xH_2O$ in 100 ml of ethanol and stirring 40 ml of the ethanol solution in which 15 g of terpineol and 0.75 g of ethylcellulose were mixed.

The paste was coated onto an FTO glass substrate by spin coating, and then heat-treated at 450° C. for 40 minutes in air, thereby forming a light-absorbing oxide thin-film.

The oxide thin-film was heat-treated at 500° C. for 40 minutes under an $H_2S$ (1000 ppm)/Ar atmosphere, and then at 500° C. for 40 minutes under a Se/Ar atmosphere, thereby forming a CIS light-absorption layer thin-film.

2. EVALUATION (1) XRD Analysis

A result of XRD pattern analysis for the CIS light-absorption layer thin-film of Example 1 is shown in FIG. 1.

In FIG. 1, the XRD pattern analysis result showed that a CuInSSe single-phase was successfully formed in the CIS thin-film of the inventive example.

(2) OM Analysis

Figure 2:
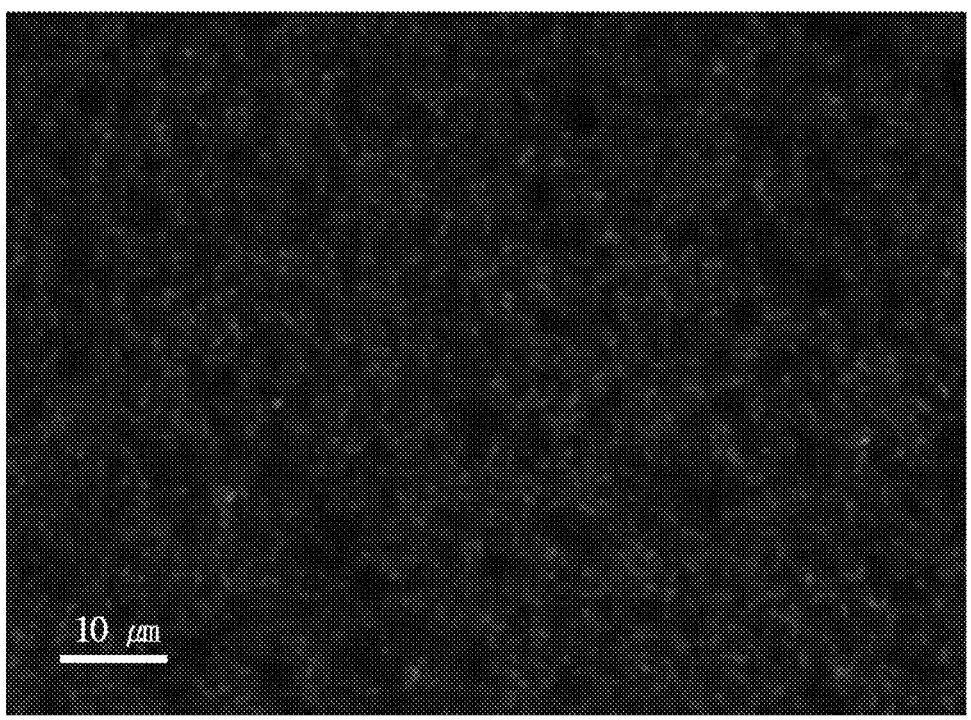
FIG. 2 shows a result of OM (optical microscope) analysis for the light-absorption layer prepared in Example 1.

An OM data analysis result for the light-absorption layer prepared in Example 1 is shown in FIG. 2.

From the OM analysis result of FIG. 2, it could be seen that the light-absorption layer was uniformly formed by the method according to the present invention.

(3) SEM Analysis

Figure 3A:
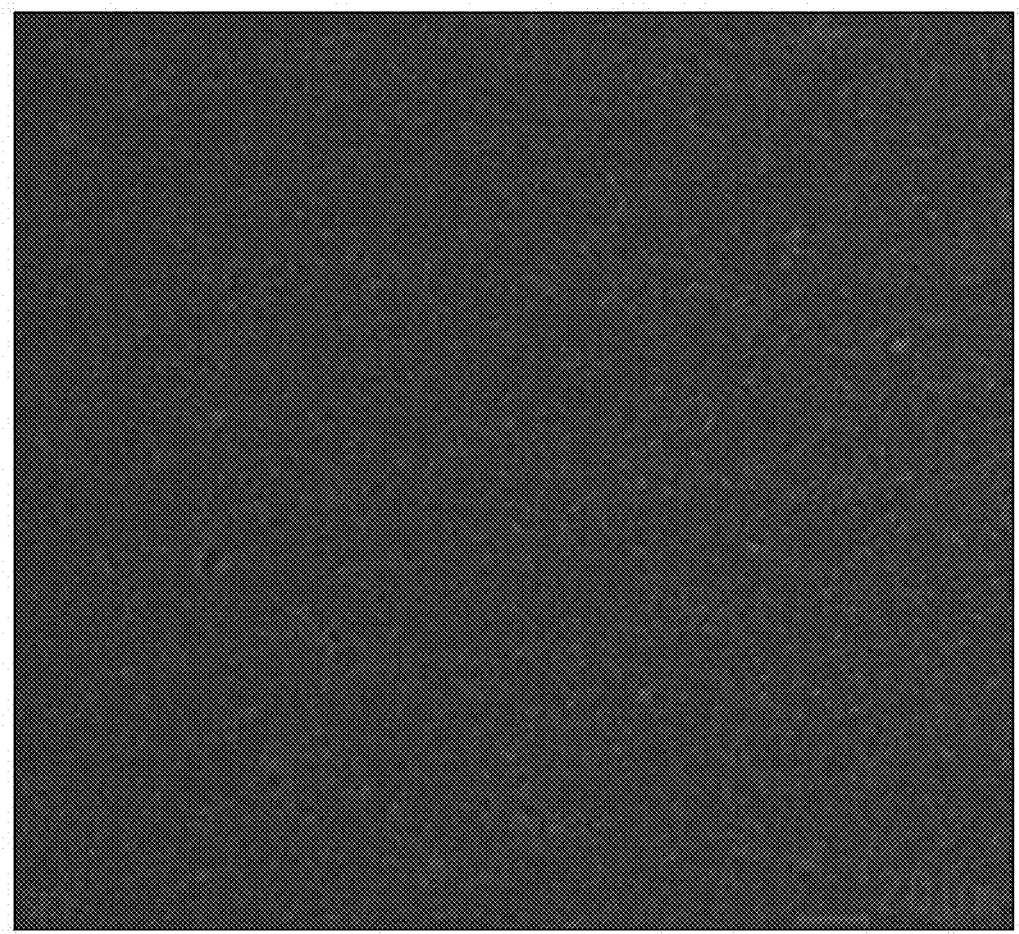
Figure 3B:
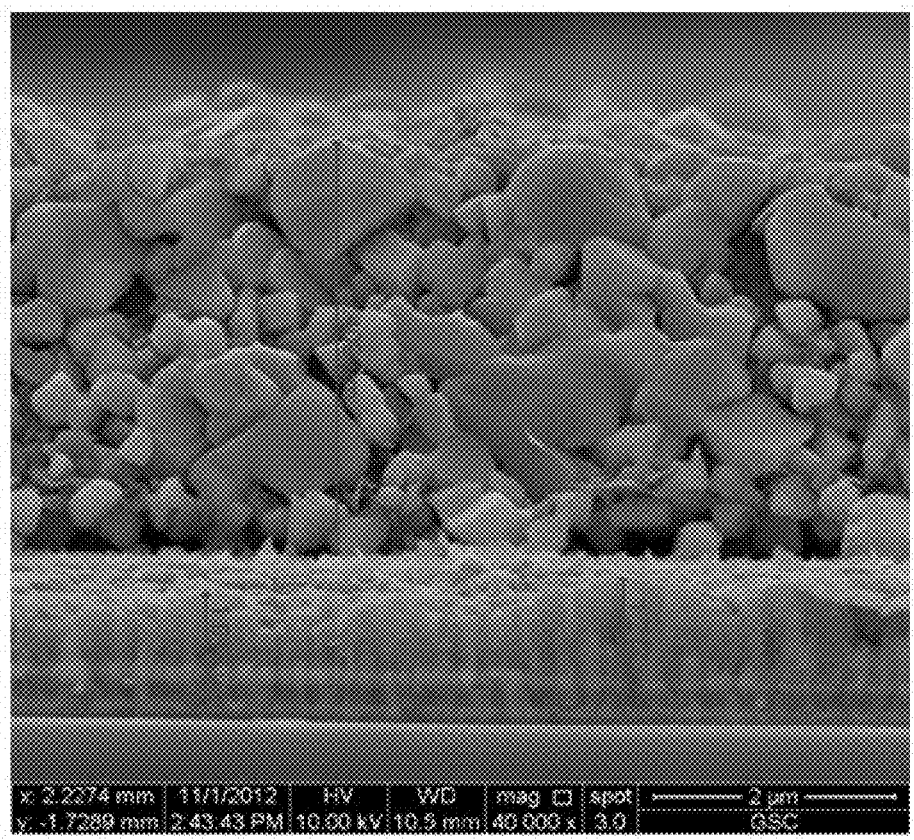

SEM data analysis was performed as to the light-absorption layer prepared in Example 1, and results are shown in FIG. 3.

From FIGS. 3(a) and (b), it could be seen that the light-absorption layer formed by the method according to the present invention had high reliability and a dense structure.

(4) EDS Data Analysis

EDS data analysis was performed as to the light-absorption layer prepared in Example 1, and results are shown in the following Table 1.

TABLE 1

| Kind of atom | at % |
|---|---|
| C | 5.7 |
| O | 8.4 |
| Cu | 17.6 |
| In | 21.5 |
| S | 18.2 |
| Se | 28.5 |

As can be seen from Table 1, the light-absorption layer prepared by the method of the present invention has a very low amount of carbon impurities.

As can be known from these results, the light-absorption layer prepared by the method of the present invention has very high reliability. In addition, as compared with a typical method like Comparative Example in which the light-absorption layer is prepared using a metal organic precursor paste using a binder, the method of the present invention can minimize carbon impurities in the light-absorption layer and thus improve conversion efficiency of a solar cell.

Although some embodiments have been described above, it should be understood that these embodiments are provided for illustration only, and that various modifications, changes, alterations, and equivalent embodiments can be made by those skilled in the art without departing from the spirit and scope of the invention. Therefore, the scope of the invention should be limited only by the accompanying claims and equivalents thereof.

The invention claimed is:

1. A method for preparing a light-absorption layer for CIS or CIGS-based solar cells, comprising:
   (a) preparing a light-absorption ink, the light-absorption ink comprising a precursor of copper, indium, or gallium as an organic metal precursor, a solvent, and sulfur or selenium, wherein a ligand in the organic metal precursor exhibits keto-enol tautomerism; and
   (b) coating the light-absorption ink onto a substrate, followed by heat treatment.

2. The method according to claim 1, wherein the precursor of copper, indium or gallium comprises an acetylacetonate compound, the solvent comprises a ketone compound, and an acetylacetonate structure in the precursor is transformed into a keto form by keto-enol tautomerism to be removed together with the solvent upon heat treatment.

3. The method according to claim 1, further comprising:
   forming a complex with the metal organic precursor using a chelating agent.

4. The method according to claim 1, wherein the precursors of copper, indium and gallium comprise copper acetylacetonate, indium acetylacetonate, and gallium acetylacetonate, respectively.

5. The method according to claim 1, wherein the precursors of copper, indium and gallium have a mole ratio of 1:0.5 to 2:0 to 2.

6. The method according to claim 3, wherein the chelating agent comprises at least one amine or amine alcohol selected from among monoalkylamine ($RNH_2$; R being a $C_1$ to $C_8$ alkyl group), dialkylamine ($R_1R_2NH$: $R_1$ and $R_2$ being a $C_1$ to $C_8$ alkyl group), trialkylamine ($R_1R_2R_3N$: $R_1$, $R_2$ and $R_3$ being a $C_1$ to $C_8$ alkyl group), diamine ($R_1R_2N$—R—$NR_3R_4$; R, $R_1$, $R_2$, $R_3$ and $R_4$ being H or a $C_1$ to $C_8$ alkyl group), monoalcoholamine ($RHN_2OH$: R being a $C_1$ to $C_8$ alkyl group), dialcoholamine [($R_1OH$)($R_2OH$)NH: $R_1$ and $R_2$ being a $C_1$ to $C_8$ alkyl group], trialcoholamine [($R_1OH$)($R_2OH$)($R_3OH$)N: $R_1$, $R_2$ and $R_3$ being a $C_1$ to $C_8$ alkyl group].

7. The method according to claim 2, wherein the ketone compound comprises at least one selected from among acetylacetone, acetone, methylacetylacetate, tertbutyl acetoacetate, and ethyl-2-methylacetoacetate.

8. The method according to claim 1, wherein heat treatment is performed at a temperature ranging from 100° C. to 400° C.

9. The method according to claim 1,
   the method comprising;
   obtaining a CI thin-film or a CIG thin-film reduced, sulfurized, or selenized by heat treatment of the thin film under a hydrogen, sulfurization or selenization atmosphere heat treatment of the thin film under a hydrogen, wherein sulfurization or selenization atmosphere is performed at a temperature ranging from 400° C. to 600° C., following coating the light-absorption ink onto a substrate and heat treatment.

10. A light-absorption ink for CIS-based or CIGS-based solar cells, comprising:
   a precursor of copper, indium, or gallium as an organic metal precursor;
   a solvent; and
   sulfur or selenium,
   wherein a ligand in the organic metal precursor exhibits keto-enol tautomerism.

11. The light-absorption ink according to claim 10, wherein a complex with the metal organic precursor is formed using a chelating agent.

12. The light-absorption ink according to claim 10, wherein the precursors of copper, indium and gallium comprise copper acetylacetonate, indium acetylacetonate, and gallium acetylacetonate, respectively, and the solvent comprises a ketone compound.

13. The light-absorption ink according to claim 10, wherein the precursors of copper, indium and gallium have a mole ratio of 1:0.5 to 2:0 to 2.

14. The light-absorption ink according to claim 12, wherein the ketone compound comprises at least one selected from among acetylacetone, acetone, methylacetylacetate, tertbutyl acetoacetate, and ethyl-2-methylacetoacetate.

15. The light-absorption ink according to claim 11, wherein the chelating agent comprises at least one amine or amine alcohol selected from among monoalkylamine (RNH2; R being a C1 to C8 alkyl group), dialkylamine (R1R2NH: R1 and R2 being a C1 to C8 alkyl group), trialkylamine (R1R2 R3N: R1, R2 and R3 being a C1 to C8 alkyl group), diamine (R1R2N—R—NR3R4; R, R1, R2, R3 and R4 being H or a C1 to C8 alkyl group), monoalcoholamine (RHN2OH: R being a C1 to C8 alkyl group), dialcoholamine [(R1OH)(R2OH)NH: R1 and R2 being a C1 to C8 alkyl group], trialcoholamine [(R1OH)(R2OH)(R3OH)N: R1, R2 and R3 being a C1 to C8 alkyl group].

16. The method according to claim 2, further comprising: forming a complex with the metal organic precursor using a chelating agent.

17. The method according to claim 2, wherein the precursors of copper, indium and gallium comprise copper acetylacetonate, indium acetylacetonate, and gallium acetylacetonate, respectively.

18. The method according to claim 2, wherein the precursors of copper, indium and gallium have a mole ratio of 1:0.5 to 2:0 to 2.

19. The method according to claim 16, wherein the chelating agent comprises at least one amine or amine alcohol selected from among monoalkylamine (RNH2; R being a C1 to C8 alkyl group), dialkylamine (R1R2NH: R1 and R2 being a C1 to C8 alkyl group), trialkylamine (R1R2 R3N: R1, R2 and R3 being a C1 to C8 alkyl group), diamine (R1R2N—R—NR3R4; R, R1, R2, R3 and R4 being H or a C1 to C8 alkyl group), monoalcoholamine (RHN2OH: R being a C1 to C8 alkyl group), dialcoholamine [(R1OH)(R2OH)NH: R1 and R2 being a C1 to C8 alkyl group], trialcoholamine [(R1OH)(R2OH)(R3OH)N: R1, R2 and R3 being a C1 to C8 alkyl group].

20. The method according to claim 2, wherein heat treatment is performed at a temperature from 100° C. to 400° C.

* * * * *